United States Patent
Chuang et al.

(10) Patent No.: US 12,191,274 B2
(45) Date of Patent: Jan. 7, 2025

(54) NANO-TWINNED STRUCTURE ON METALLIC THIN FILM SURFACE AND METHOD FOR FORMING THE SAME

(71) Applicant: AG MATERIALS TECHNOLOGY CO., LTD., Hsinchu (TW)

(72) Inventors: Tung-Han Chuang, Hsinchu (TW); Po-Ching Wu, Hsinchu (TW); Pei-Ing Lee, Hsinchu (TW); Hsing-Hua Tsai, Hsinchu (TW)

(73) Assignee: AG MATERIALS TECHNOLOGY CO., LTD., Hsinchu (TW)

( * ) Notice: Subject to any disclaimer, the term of this patent is extended or adjusted under 35 U.S.C. 154(b) by 38 days.

(21) Appl. No.: 17/833,822

(22) Filed: Jun. 6, 2022

(65) Prior Publication Data

US 2023/0090030 A1    Mar. 23, 2023

(30) Foreign Application Priority Data

Sep. 22, 2021    (TW) .................................. 110135030

(51) Int. Cl.
| | |
|---|---|
| *H01L 23/00* | (2006.01) |
| *C23C 14/02* | (2006.01) |
| *C23C 14/16* | (2006.01) |
| *C23C 14/22* | (2006.01) |
| *C23C 30/00* | (2006.01) |

(52) U.S. Cl.
CPC ............ *H01L 24/27* (2013.01); *C23C 14/025* (2013.01); *C23C 14/16* (2013.01); *C23C 14/22* (2013.01); *C23C 30/00* (2013.01)

(58) Field of Classification Search
CPC ........ C23C 14/025; C23C 14/16; C23C 14/22
See application file for complete search history.

(56) References Cited

U.S. PATENT DOCUMENTS

| | | | |
|---|---|---|---|
| 2013/0089674 A1* | 4/2013 | Chueh ............... | H01L 21/76838 |
| | | | 427/533 |
| 2014/0294651 A1 | 10/2014 | Roy et al. | |
| 2015/0275350 A1* | 10/2015 | Ott ........................ | C23C 14/541 |
| | | | 204/192.15 |

FOREIGN PATENT DOCUMENTS

| | | | |
|---|---|---|---|
| TW | 201315823 A | | 4/2013 |
| TW | 202028105 A | | 8/2020 |
| TW | I 703226 B | * | 9/2020 |
| TW | 202129028 A | | 8/2021 |

\* cited by examiner

*Primary Examiner* — Kelly M Gambetta

(57) ABSTRACT

A nano-twinned structure on a metallic thin film surface is provided. The nano-twinned structure includes a substrate, an adhesive-lattice-buffer layer over the substrate, and a metallic thin film including Ag, Cu, Au, Pd or Ni over the adhesive-lattice-buffer layer. The bottom region of the metallic thin film has equi-axial coarse grains. The surface region of the metallic thin film contains parallel-arranged high-density twin boundaries (Σ3+Σ9) with a pitch from 1 nm to 100 nm. The quantity of the parallel-arranged twin boundaries is 50% to 80% of the total quantity of twin boundaries in the cross-sectional view of the metallic thin film. The parallel-arranged twin boundaries include 30% to 90% [111] crystal orientation. The nano-twinned structure on the metallic thin film surface is formed through a post-deposition ion bombardment on the evaporated metallic thin film surface after the evaporation process.

5 Claims, 7 Drawing Sheets

NANO-TWINNED STRUCTURE ON METALLIC THIN FILM SURFACE AND METHOD FOR FORMING THE SAME

CROSS-REFERENCE TO RELATED APPLICATIONS

The present application claims priority of Taiwan Application No. 110135030, filed on Sep. 22, 2021, which is incorporated by reference herein in its entirety.

BACKGROUND

Technical Field

The present disclosure relates to a metallic thin film and a method for forming the same, and more particularly to a metallic thin film with a high-density metallic nano-twinned structure on the surface region thereof and a method for forming the same.

Description of the Related Art

The overall structure of conventional metallic thin films is mostly equi-axial grains with grain sizes of several microns or more. U.S. Patent Publication No. US20150275350A1 discloses a structure of silver or silver alloy nano-twinned thin film sputtered directly on a silicon substrate. The silver or silver alloy nano-twinned thin film has better tensile strength and conductivity than ordinary grains or nano equi-axial grains. However, the silver or silver alloy nano-twinned density is less than 30%.

Taiwan Patent No. I703226 discloses a structure of silver nano-twinned thin film sputtered on surface of a silicon chip, and its nano-twinned density can reach 75%. However, the sputtering method is extremely costly and the production rate is low. It is known that evaporation of thin films has the advantages of low cost and high production efficiency. Although Taiwan Patent No. I703226 also discloses a structure of silver nano-twinned thin film evaporated directly on surface of a silicon chip, its nano-twinned density is only 50%. Regardless of whether sputtering or a direct evaporation method is used, Taiwan Patent No. I703226 fails to disclose the formation of high-density copper, gold, palladium or nickel nano-twinned thin film structures.

Taiwan Patent No. I432613 discloses a method for electroplating a copper nano-twinned thin film. Taiwan Patent No. I521104 discloses a method for electroplating a copper seed layer and then electroplating nickel nano-twinned thin film. Taiwan Patent No. I507548 discloses a method for electroplating a gold nano-twinned thin film. These conventional techniques can form a large number of parallel-arranged nano-twinned thin films on a substrate. However, they all use a high-speed rotary electroplating method at a speed of 50 rpm or even 1,500 rpm. It is difficult to control the process and film quality. The resulting distance between twin boundaries is large, and the parallel-arranged twin boundaries include only 90% or even only 50% of the crystal orientation [111]. In addition, the electroplating waste produced by the electroplating process also raises environmental concerns.

In the conventional metallic thin films mentioned above, the film-coating technology is used to form a nano-twinned structure in the overall thin film. The formation rate of the thin film is extremely slow. The thickness of the thin film is generally below 10 microns, and there are still many shortcomings in the formation technology. However, it is known that the application of nano twins in the low-temperature die bonding of semiconductor chips and ceramic substrates, as well as the direct bonding of 3D-IC chips or wafers at low temperature, is mainly the nano twins with high density [111] preferred crystal orientation located on the surface region of the thin film. Its high diffusion rate is utilized. In fact, it is not affected by the grain structure located in the bottom region of the metallic thin film.

Taiwan Patent No. I419985 discloses the electroplating of silver, copper, gold or nickel thin film on a silicon oxide substrate. The metallic thin film formed by the electroplating is then bombarded with an ion beam to form mechanical twins. However, the distance between twin boundaries is between 8.3 nm and 45.6 nm. The distribution of crystal orientation is disorderly, and a large number of parallel-arranged nano twins cannot be formed. The nano-twinned density is also less than 50%. In the manufacturing process, Taiwan Patent No. I419985 not only uses electroplating, but also uses ion beam to bombard the metallic thin film formed by the electroplating. Liquid nitrogen is required to maintain a low temperature below $-20°$ C., and the applied ion beam voltage is as high as 4 KeV to 5 KeV, which results in extremely low production efficiency and extremely high production costs.

SUMMARY

Some embodiments of the present disclosure provide a nano-twinned structure on a metallic thin film surface, including: a substrate; an adhesive-lattice-buffer layer over the substrate; and a metallic thin film over the adhesive-lattice-buffer layer. The bottom region of the metallic thin film includes equi-axial coarse grains. The surface region of the metallic thin film includes a high-density nano-twinned structure. The nano-twinned structure located in the surface region contains parallel-arranged twin boundaries ($\Sigma 3+\Sigma 9$). The quantity of the parallel-arranged twin boundaries accounts for 50% to 80% of the total quantity of twin boundaries in the cross-sectional view of the metallic thin film. The parallel-arranged twin boundaries include 30% to 90% [111] crystal orientation. The material of the metallic thin film containing high-density nano twins in the surface region thereof includes silver, copper, gold, palladium or nickel.

Some embodiments of the present disclosure provide a method for forming a nano-twinned structure on a metallic thin film surface, including: forming an adhesive-lattice-buffer layer on a substrate; evaporating a metallic thin film on the adhesive-lattice-buffer layer; and performing an ion-beam bombardment on the metallic thin film formed by the evaporation. The bottom region of the metallic thin film retains equi-axial coarse grains. The surface region of the metallic thin film is transformed into a high-density nano-twinned structure. The nano-twinned structure located in the surface region contains parallel-arranged twin boundaries ($\Sigma 3+\Sigma 9$). The quantity of the parallel-arranged twin boundaries accounts for 50% to 80% of the total quantity of twin boundaries in the cross-sectional view of the metallic thin film. The parallel-arranged twin boundaries include 30% to 90% [111] crystal orientation. The material of the metallic thin film containing high-density nano twins in the surface region thereof includes silver, copper, gold, palladium or nickel.

The present disclosure applies ion bombardment to the evaporated metallic thin film with equi-axial coarse grains to transform its surface into high-density nano twins, which has a competitive advantage in production efficiency, and the thickness of the metallic thin film is not limited.

The present disclosure uses evaporation technology, which is different from electroplating. Since the metallic thin film undergoes a melting and solidification step during the evaporation process, the metallic thin film will shrink in volume relative to the chip, resulting in tensile stress. An ion-beam bombardment is then performed on the metallic thin film formed by the evaporation. The compressive stress of ion-beam bombardment causes stress relaxation on the surface of the metallic thin film, which can trigger the formation of high-density nano twins. The disclosed process only needs to be performed at room temperature, and the ion beam voltage used is only about 0.1 KeV, which is much lower than the method of Taiwan Patent No. I419985.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1A:
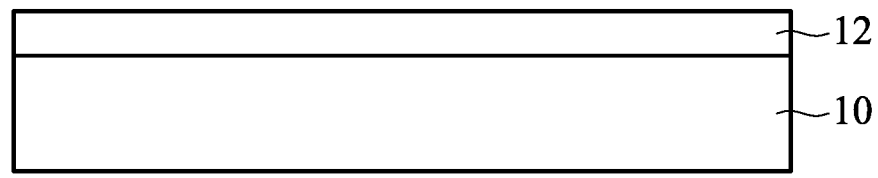
FIGS. 1A and 1B are cross-sectional views of a structure including an adhesive-lattice-buffer layer and a metallic thin film at different stages in accordance with some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Some variations of embodiments are described below. In different figures and illustrated embodiments, similar element symbols are used to indicate similar elements. It is appreciated that additional operations can be provided before, during, and/or after the stages described in these embodiments. Some of the stages that are described can be replaced or eliminated for different embodiments.

Furthermore, spatially relative terms, such as "beneath," "below," "lower," "overlapped," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The term "substantially" in the description, such as in "substantially peeling" will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%.

Embodiments of the present disclosure provide a nano-twinned structure on a metallic thin film surface, including: a substrate; an adhesive-lattice-buffer layer over the substrate; and a metallic thin film over the adhesive-lattice-buffer layer. The adhesive-lattice-buffer layer enhances the bonding force between the substrate and the metallic thin film. In addition, the adhesive-lattice-buffer layer may reduce the influence of the crystal orientation of the substrate on the metallic thin film. The bottom region of the metallic thin film includes equi-axial coarse grains. The surface region of the metallic thin film includes a high-density nano-twinned structure. The nano-twinned structure located in the surface region contains parallel-arranged twin boundaries (Σ3+Σ9). The quantity of the parallel-arranged twin boundaries accounts for 50% to 80% of the total quantity of twin boundaries in the cross-sectional view of the metallic thin film. The parallel-arranged twin boundaries include 30% to 90% [111] crystal orientation. The material of the metallic thin film containing high-density nano twins in the surface region thereof includes silver, copper, gold, palladium or nickel.

In general, the lower the stacking-fault energy of the metal material, the easier it is to form a twin structure. The metal materials selected in the present disclosure all have very low stacking-fault energy, such as silver (25 mJ/m$^2$), copper (70 mJ/m$^2$), gold (45 mJ/m$^2$), palladium (130 mJ/m$^2$) and nickel (225 mJ/m$^2$), which are all conducive to the formation of the nano-twinned structure. In addition, the resistivity of the metal materials selected in the present disclosure is also low, such as silver (1.63 μΩ·cm), copper (1.69 μΩ·cm), gold (2.2 μΩ·cm), palladium (10.8 μΩ·cm) and nickel (6.90 μΩ·cm), and they can provide excellent conductivity for three-dimensional integrated circuit (3D-IC) wafer packaging.

In addition to the characteristics of the metal itself, the characteristics of the twin structure, such as better resistance to oxidation, resistance to corrosion, electrical conductivity, thermal conductivity, and high temperature stability, etc., make the high-density nano-twinned film layer with the preferred crystal orientation [111] contained on the surface of the metallic thin film provided by the embodiments of the present disclosure has a high diffusion rate, which is more applicable in low-temperature die bonding of a semiconductor chip and ceramic substrate, and in low-temperature direct bonding of 3D-IC chip or wafer. In conventional metallic thin films, the film-coating technology is used to form a nano-twinned structure in the overall thin film. The formation rate of the thin film is extremely time-consuming. The thickness of the thin film is generally below 10 microns, and there are still many shortcomings in the formation technology. However, it is known that the application of nano twins in the low-temperature die bonding of semiconductor chips and ceramic substrates, as well as the direct bonding of 3D-IC chips or wafers at low temperature, is mainly the nano twins with high density [111] preferred crystal orientation located on the surface region of the thin film. Its high diffusion rate is utilized. In fact, it is not affected by the grain structure located in the bottom region of the metallic thin film. Therefore, the present disclosure applies ion bombardment to the evaporated metallic thin film with equi-axial coarse grains to transform its surface into high-density nano twins, which has a competitive advantage in production efficiency, and the thickness of the metallic thin film is not limited.

Taiwan Patent No. I419985 discloses the electroplating of silver, copper, gold or nickel thin film on a silicon oxide substrate. The metallic thin film formed by the electroplating is then bombarded with an ion beam to form mechanical twins. However, the distance between twin boundaries is between 8.3 nm and 45.6 nm. The distribution of crystal orientation is disorderly, and a large number of parallel-arranged nano twins cannot be formed. The nano-twinned density is also less than 50%. In the manufacturing process, Taiwan Patent No. I419985 not only uses electroplating, but also uses ion beam to bombard the metallic thin film formed by the electroplating. Liquid nitrogen is required to maintain a low temperature below −20° C., and the applied ion beam voltage is as high as 4 KeV to 5 KeV, which results in extremely low production efficiency and extremely high production costs. The present disclosure uses evaporation technology, which is different from electroplating. Since the metallic thin film undergoes a melting and solidification step during the evaporation process, the metallic thin film will shrink in volume relative to the chip, resulting in tensile stress. An ion-beam bombardment is then performed on the metallic thin film formed by the evaporation. The compressive stress of ion-beam bombardment causes stress relaxation on the surface of the metallic thin film, which can trigger the formation of high-density nano twins. The disclosed process only needs to be performed at room temperature, and the ion beam voltage used is only about 0.1 KeV, which is much lower than the method of Taiwan Patent No. I419985.

Figure 1B:
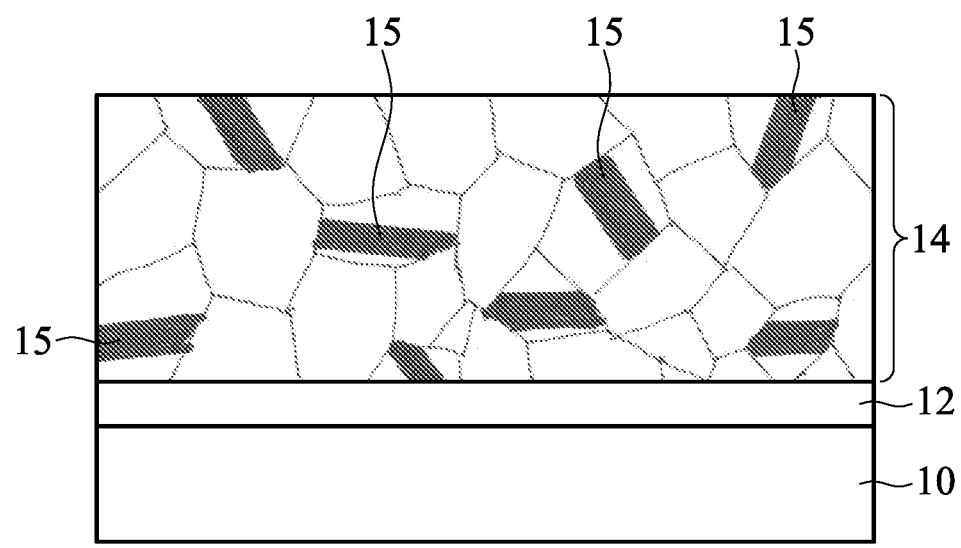

In accordance with some embodiments, FIGS. 1A and 1B illustrate cross-sectional views of an adhesive-lattice-buffer layer 12 and a metallic thin film 14 at different stages.

Referring to FIG. 1A, the adhesive-lattice-buffer layer 12 is formed on a substrate 10. The adhesive-lattice-buffer layer 12 improves the bonding force between the substrate and the metallic nano-twinned thin film, and also has a lattice buffering effect. In some embodiments, the substrate 10 includes a silicon substrate, a silicon carbide substrate, a gallium arsenide substrate, a sapphire substrate or a glass substrate.

In some embodiments, the adhesive-lattice-buffer layer 12 may include titanium, chromium, aluminum or a combination thereof. In some embodiments, the thickness of the titanium-containing adhesive-lattice-buffer layer 12 may be 0.01 μm to 0.1 μm, such as 0.1 μm to 0.05 μm. In some embodiments, the thickness of the chromium-containing adhesive-lattice-buffer layer 12 may be 0.05 μm to 1 μm, such as 0.1 μm to 0.5 μm. In some embodiments, the thickness of the aluminum-containing adhesive-lattice-buffer layer 12 may be 0.1 μm to 1 μm, such as 0.1 μm to 0.5 μm. It should be understood that the thickness of the adhesive-lattice-buffer layer 12 may be appropriately adjusted according to practical applications, and is not intended to be limiting.

In accordance with other embodiments, as shown in FIG. 1A, the adhesive-lattice-buffer layer 12 may be formed on the substrate 10 by a sputtering or evaporation method.

In some embodiments, the sputtering adopts single-gun sputtering or multi-gun co-sputtering. In the sputtering process, the power source may use, for example, DC, DC plus, RF, or high-power impulse magnetron sputtering (HIPIMS). The sputtering power of the adhesive-lattice-buffer layer 12 may be, for example, about 100 W to about 500 W. The temperature of the sputtering process is room temperature, but the temperature will rise by about 50° C. to about 200° C. during the sputtering process. The background pressure of the sputtering process is $1 \times 10^{-5}$ Torr. The working pressure may be, for example, about $1 \times 10^{-3}$ Torr to about $1 \times 10^{-2}$ Torr. The flow rate of argon is about 10 sccm to about 20 sccm. The rotation speed of the stage may be, for example, about 5 rpm to about 20 rpm. The bias voltage applied to the substrate during the sputtering process is about −100V to about −200V. The deposition rate of the adhesive-lattice-buffer layer 12 may be, for example, about 0.5 nm/s to about 3 nm/s. It should be understood that the parameters of the sputtering process described above may be appropriately adjusted according to practical applications, and are not intended to be limiting.

In some embodiments, the background pressure of the evaporation process is $1 \times 10^{-5}$ Torr. The working pressure may be, for example, about $1 \times 10^{-4}$ Torr to about $5 \times 10^{-4}$ Torr. The flow rate of argon is about 2 sccm to about 10 sccm. The rotation speed of the stage may be, for example, about 5 rpm to about 20 rpm. The deposition rate of the adhesive-lattice-buffer layer 12 may be, for example, about 1 nm/s to about 5.0 nm/s. It should be understood that the parameters of the evaporation process described above may be appropriately adjusted according to practical applications, and are not intended to be limiting.

Referring to FIG. 1B, the metallic thin film 14 with equi-axial coarse grains 15 is formed on the adhesive-lattice-buffer layer 12 using an evaporation technique. The material of the metallic thin film 14 includes silver, copper, gold, palladium or nickel. The metallic thin film 14 has equi-axial coarse grains 15. The thickness of the metallic thin film 14 is 1 micron to 100 microns.

In some embodiments, the vacuum degree of the evaporation process may be, for example, $10^{-2}$ Torr to $10^{-6}$ Torr, or $10^{-3}$ Torr to $10^{-6}$ Torr. The scanning frequency of the evaporation electron beam may be, for example, about 2 Hz. The rotation speed of the evaporation stage may be 1 rpm to 20 rpm, or 5 rpm to 10 rpm. The evaporation rate of the metallic thin film 14 may be, for example, 0.1 nm/s to 100 nm/s, or 0.1 nm/s to 10 nm/s, or 0.2 nm/s to 1 nm/s. It should be understood that the parameters of the evaporation process described above may be appropriately adjusted according to practical applications, and are not intended to be limiting.

Figure 2A:
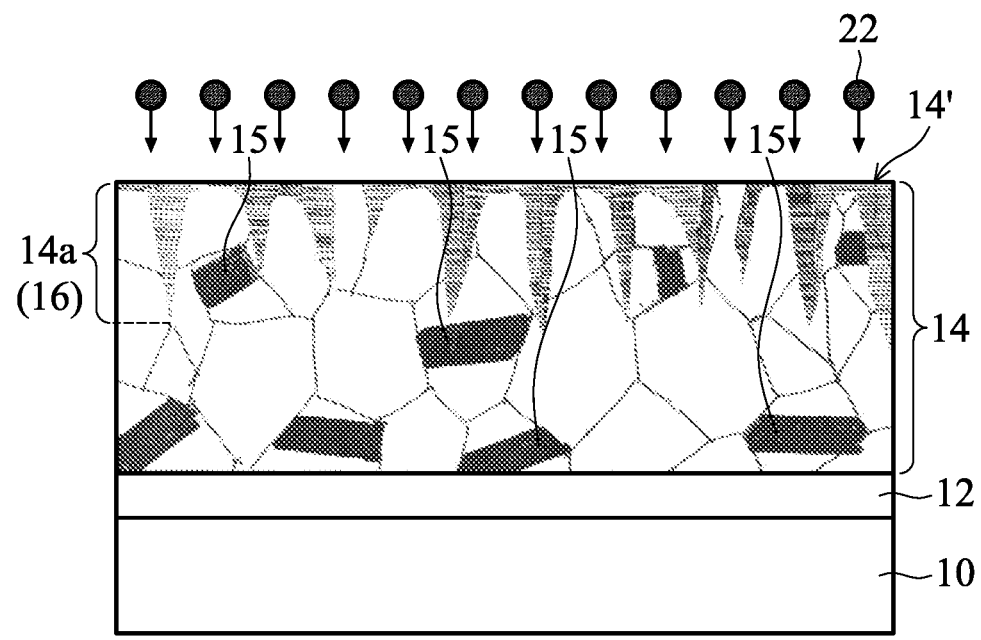
FIG. 2A is a cross-sectional view of applying an ion-beam bombardment on the surface of the metallic thin film formed by FIG. 1B in accordance with some embodiments of the present disclosure.

Referring to FIG. 2A, an ion-beam bombardment 22 is performed on the upper surface 14' of the metallic thin film 14 containing equi-axial coarse grains 15 to transform the equi-axial coarse grains in the surface region 14a of the metallic thin film 14 into a high-density nano-twinned layer 16. The thickness of the nano-twinned layer 16 is about 0.1 micrometers to 90 micrometers. The nano-twinned layer 16 accounts for about 10% to 90% of the metallic thin film 14. The nano-twinned layer 16 located in the surface region 14a has nano-scale parallel-arranged twin boundaries (Σ3+Σ9), and the distance between the nano-scale parallel-arranged twin boundaries may be, for example, 1 nm to 100 nm. In some embodiments, the ion-beam bombardment 22 may use an argon ion beam or an oxygen ion beam. The flow rate of the ion beam may be 1 sccm to 20 sccm, or 3 sccm to 10 sccm. The voltage of the ion gun may be 10 KV to 5 KV, or 50V to 150V, or 60V to 100V. The current of the ion gun may be 0.2 A to 20 A. The temperature of the ion-beam bombardment may be 0° C. to 50° C. The voltage of the ion-beam bombardment may be 0.01 KeV to 1 KeV. The time of the ion-beam bombardment may be 15 minutes to 10 hours. It should be understood that the parameters of the ion-beam bombardment process described above may be appropriately adjusted according to practical applications, and are not intended to be limiting.

Figure 2B:
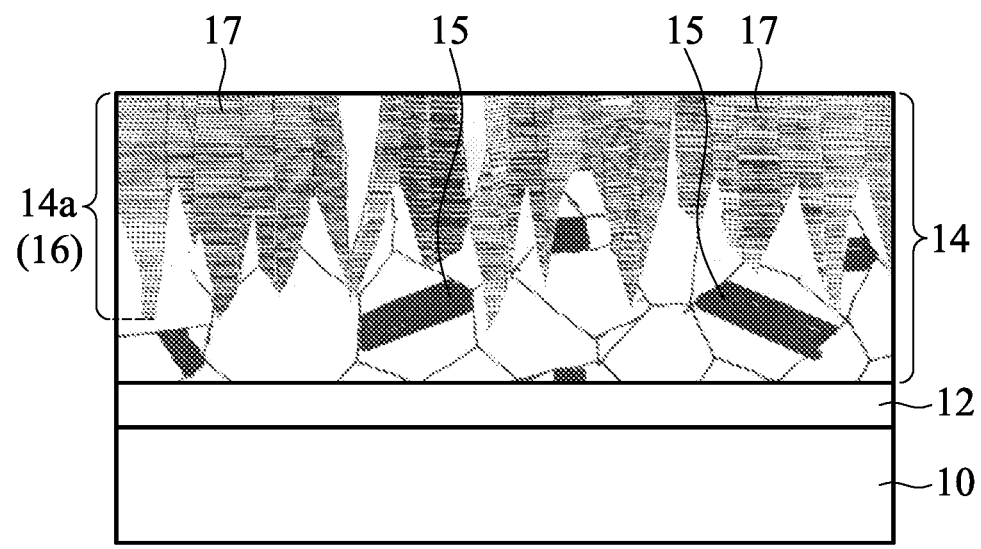
FIG. 2B is a cross-sectional view of a structure including an adhesive-lattice-buffer layer and a metallic thin film containing nano twins in the surface region thereof in accordance with some embodiments of the present disclosure.

In accordance with some embodiments, as shown in FIG. 2B, the nano-twinned layer 16 located in the surface region 14a of the metallic thin film 14 includes parallel-stacked nano-twinned pillars 17. In some embodiments, the thickness of the nano-twinned layer 16 may be 0.1 μm to 10 μm, such as 0.5 μm to 5 μm. In some embodiments, the diameters of the nano-twinned pillars 17 in the nano-twinned layer 16 may be 0.01 μm to 10 μm, such as 0.3 μm to 0.5 μm. It should be understood that the thickness of the nano-twinned layer 16 located in the surface region 14a of the metallic thin film 14 and the diameters of the nano-twinned pillars 17 may be appropriately adjusted according to practical applications, and are not intended to be limiting.

In the prior art, the silver nano-twinned thin films are directly sputtered on the substrates with (111) and (110) crystal orientations (D. Bufford, H. Wang, and X. Zhang, High Strength Epitaxial Nano-Twinned Ag Films, Acta Materialia, 59, 2011, pp. 93-101). However, the literature of Bufford et al. pointed out that the silver nano-twinned thin films with high twin density can be sputtered on the (111) substrate only, and the nano-twinned density is less than 50%. Especially, the silver nano-twinned thin film deposited on the (110) substrate has a very low twin density. Moreover, the twin boundaries distort from the direction of growth of the thin film by up to 60°.

Taiwan Patent No. I703226 discloses sputtering a silver nano-twinned thin film structure on surface of a silicon chip, and its nano-twinned density can reach 75%. However, the sputtering method is extremely costly and the production rate is low. It is known that evaporation of thin films has the advantages of low cost and high production efficiency. Although Taiwan Patent No. I703226 also discloses directly evaporating a silver nano-twinned thin film structure on surface of a silicon chip, its nano-twinned density is lower than 50%.

Taiwan Patent No. I432613 discloses a method for electroplating a copper nano-twinned thin film. Taiwan Patent No. I521104 discloses a method for electroplating a copper seed layer and then electroplating nickel nano-twinned thin film. Taiwan Patent No. I507548 discloses a method for electroplating a gold nano-twinned thin film. These conventional techniques can form a large number of parallel-arranged nano-twinned thin films on a substrate. However, they all use a high-speed rotary electroplating method at a speed of 50 rpm or even 1,500 rpm. It is difficult to control the process and film quality. The resulting distance between twin boundaries is large, and the parallel-arranged twin boundaries include only 90% or even only 50% of the crystal orientation [111]. In addition, the electroplating waste produced by the electroplating process also has environmental concerns.

In the conventional metallic thin films mentioned above, the film-coating technology is used to form a nano-twinned structure in the overall thin film. The formation rate of the thin film is extremely time-consuming. The thickness of the thin film is generally below 10 microns, and there are still many shortcomings in the formation technology. However, it is known that the application of nano twins in the low-temperature die bonding of semiconductor chips and ceramic substrates, as well as the direct bonding of 3D-IC chips or wafers at low temperature, is mainly the nano twins with high density [111] preferred crystal orientation located on the surface region of the thin film. Its high diffusion rate is utilized. In fact, it is not affected by the grain structure located in the bottom region of the metallic thin film. Therefore, the present disclosure applies ion bombardment to the evaporated metallic thin film with equi-axial coarse grains to transform its surface into high-density nano twins, which has a competitive advantage in production efficiency, and the thickness of the metallic thin film is not limited.

Taiwan Patent No. I419985 discloses the electroplating of silver, copper, gold or nickel thin film on a silicon oxide substrate. The metallic thin film formed by the electroplating is then bombarded with an ion beam to form mechanical twins. However, the distance between twin boundaries is between 8.3 nm and 45.6 nm. The distribution of crystal orientation is disorderly, and a large number of parallel-arranged nano twins cannot be formed. The nano-twinned density is also less than 50%. In the manufacturing process, Taiwan Patent No. I419985 not only uses electroplating, but also uses ion beam to bombard the metallic thin film formed by the electroplating. Liquid nitrogen is required to maintain a low temperature below −20° C., and the applied ion beam voltage is as high as 4 KeV to 5 KeV, which results in extremely low production efficiency and extremely high production costs.

The metallic thin film undergoes solidification reaction and cooling volume shrinkage phenomenon during the evaporation process. The shrinkage rate of the metal is about 15 ppm/K to 20 ppm/K, which is higher than that of silicon chips (3 ppm/K). After being solidified and then cooled to room temperature, the metallic thin film will form tensile stress. The ion-beam bombardment can apply compressive stress to the metallic thin film and relax the tensile stress of the metallic thin film (i.e. stress relaxation). The stress relaxation can trigger the formation of nano twins. Therefore, the present disclosure further applies ion-beam bombardment on the surface of the evaporated silver thin film having equi-axial coarse grains, and successfully makes the surface region of the evaporated silver thin film produce high-density nano twins. The use of ion-beam bombardment on the surface of the evaporated silver thin film to produce a metallic thin film structure with high-density nano twins on the surface thereof also proves that it can be applied to metallic thin films with face-centered cubic crystal structure such as copper, gold, palladium, and nickel. The disclosed process only needs to be performed at room temperature, and the ion beam voltage used is only about 0.1 KeV, which is much lower than the method of Taiwan Patent No. I419985.

In accordance with some embodiments of the present disclosure, in the application of the semiconductor packaging process, the metallic thin film 14 may have solid-liquid interfacial reactions with other packaging materials, for example, in solder reflow bonding. In order to improve the bonding force between the adhesive-lattice-buffer layer 12 and the metallic thin film 14 and avoid metal of each layer diffusing into each other, a diffusion-barrier-reaction layer 18 may be formed between the adhesive-lattice-buffer layer 12 and the metallic thin film 14. The diffusion-barrier-reaction layer is formed by evaporation, sputtering or electroplating.

Figure 3A:
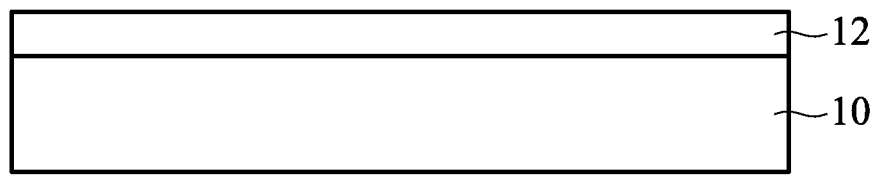
FIGS. 3A to 3C are cross-sectional views of a structure including an adhesive-lattice-buffer layer, a diffusion-barrier-reaction layer and a metallic thin film at different stages in accordance with other embodiments of the present disclosure.
Figure 3B:
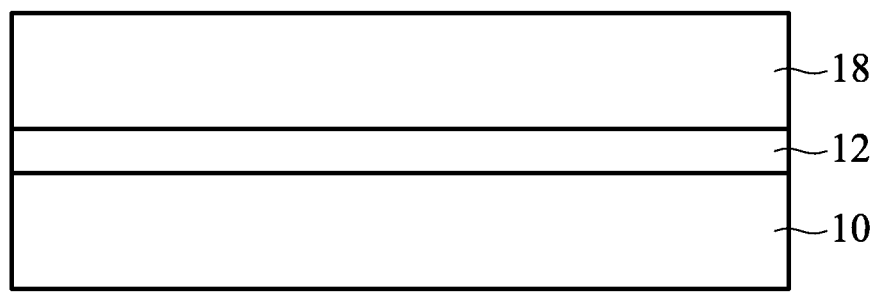
Figure 3C:
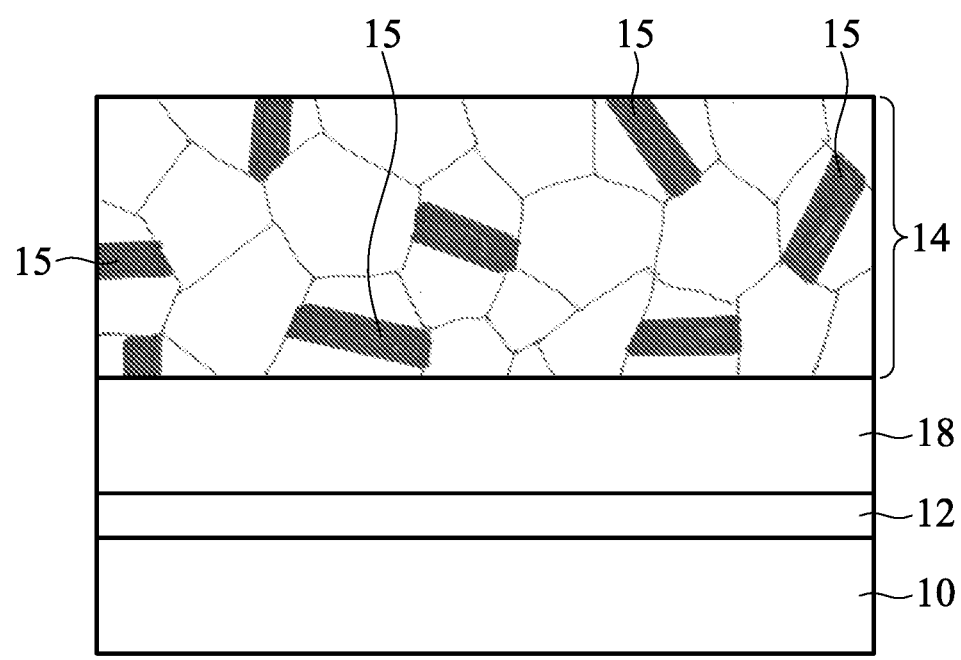

In accordance with other embodiments, FIGS. 3A to 3C are cross-sectional views of an adhesive-lattice-buffer layer 12, a diffusion-barrier-reaction layer 18 and a metallic thin film 14 at different stages. Compared to the embodiments shown in FIGS. 1A and 1B, the diffusion-barrier-reaction layer 18 is additionally formed between the adhesive-lattice-buffer layer 12 and the metallic thin film 14.

Referring to FIG. 3A, in some embodiments, for the material of the substrate 10, reference may be made to the embodiment shown in FIG. 1A. Thus, it is not repeated again.

In some embodiments, for the material of the adhesive-lattice-buffer layer 12, the thickness of the titanium-containing adhesive-lattice-buffer layer 12, the thickness of the chromium-containing adhesive-lattice-buffer layer 12 and the thickness of the aluminum-containing adhesive-lattice-buffer layer 12, reference may be made to the embodiment shown in FIG. 1A. Thus, it is not repeated again. It should be understood that the thickness of the adhesive-lattice-buffer layer 12 may be appropriately adjusted according to practical applications, and is not limited to the embodiment shown in FIG. 1A.

In accordance with some embodiments, as shown in FIG. 3A, the adhesive-lattice-buffer layer 12 may be formed on the substrate 10 by a sputtering or evaporation method.

In some embodiments, the sputtering adopts single-gun sputtering or multi-gun co-sputtering. In the sputtering process, the power source may use, for example, DC, DC plus, RF, or high-power impulse magnetron sputtering (HIPIMS). The sputtering power of the adhesive-lattice-buffer layer 12 may be, for example, about 100 W to about 500 W. The temperature of the sputtering process is room temperature, but the temperature will rise by about 50° C. to about 200° C. during the sputtering process. The background pressure of the sputtering process is $1\times10^{-5}$ Torr. The working pressure may be, for example, about $1\times10^{-3}$ Torr to about $1\times10^{-2}$ Torr. The flow rate of argon is about 10 sccm to about 20 sccm. The rotation speed of the stage may be, for example, about 5 rpm to about 20 rpm. The bias voltage applied to the substrate during the sputtering process is about −100V to about −200V. The deposition rate of the adhesive-lattice-buffer layer 12 may be, for example, about 0.5 nm/s to about 3 nm/s. It should be understood that the parameters of the sputtering process described above may be appropriately adjusted according to practical applications, and are not intended to be limiting.

In some embodiments, the background pressure of the evaporation process is $1\times10^{-5}$ Torr. The working pressure may be, for example, about $1\times10^{-4}$ Torr to about $5\times10^{-4}$ Torr. The flow rate of argon is about 2 sccm to about 10 sccm. The rotation speed of the stage may be, for example, about 5 rpm to about 20 rpm. The deposition rate of the adhesive-lattice-buffer layer 12 may be, for example, about 1 nm/s to about 5.0 nm/s. It should be understood that the parameters of the evaporation process described above may be appropriately adjusted according to practical applications, and are not intended to be limiting.

Referring to FIG. 3B, the diffusion-barrier-reaction layer 18 is formed on the adhesive-lattice-buffer layer 12. In some embodiments, the diffusion-barrier-reaction layer 18 may include nickel, copper or a combination thereof. In some embodiments, the thickness of the nickel-containing diffusion-barrier-reaction layer 18 may be 0.1 μm to 100 μm, such as 0.5 μm to 20 μm. In some embodiments, the thickness of the copper-containing diffusion-barrier-reaction layer 18 may be 0.1 μm to 300 μm, such as 1.0 μm to 100 μm. It should be understood that the thickness of the diffusion-barrier-reaction layer 18 may be appropriately adjusted according to practical applications, and is not intended to be limiting.

In accordance with some embodiments, as shown in FIG. 3B, the diffusion-barrier-reaction layer 18 may be formed on the adhesive-lattice-buffer layer 12 by sputtering, evaporation or electroplating.

In some embodiments, the sputtering adopts single-gun sputtering or multi-gun co-sputtering. In the sputtering process, the power source may use, for example, DC, DC plus, RF, or high-power impulse magnetron sputtering (HIPIMS). The sputtering power of the diffusion-barrier-reaction layer 18 may be, for example, about 100 W to about 500 W. The temperature of the sputtering process is room temperature, but the temperature will rise by about 50° C. to about 200° C. during the sputtering process. The background pressure of the sputtering process is $1\times10^{-5}$ Torr. The working pressure may be, for example, about $1\times10^{-3}$ Torr to about $1\times10^{-2}$ Torr. The flow rate of argon is about 10 sccm to about 20 sccm. The rotation speed of the stage may be, for example, about 5 rpm to about 20 rpm. The bias voltage applied to the substrate during the sputtering process is about −100V to about −200V. The deposition rate of the diffusion-barrier-reaction layer 18 may be, for example, about 0.5 nm/s to about 3 nm/s. It should be understood that the parameters of the sputtering process described above may be appropriately adjusted according to practical applications, and are not intended to be limiting.

In some embodiments, the background pressure of the evaporation process is $1\times10^{-5}$ Torr. The working pressure may be, for example, about $1\times10^{-4}$ Torr to about $5\times10^{-4}$ Torr. The flow rate of argon is about 2 sccm to about 10 sccm. The rotation speed of the stage may be, for example, about 5 rpm to about 20 rpm. The deposition rate of the diffusion-barrier-reaction layer 18 may be, for example, about 1 nm/s to about 5.0 nm/s. It should be understood that the parameters of the evaporation process described above may be appropriately adjusted according to practical applications, and are not intended to be limiting.

In some embodiments, the diffusion-barrier-reaction layer 18 can prevent the metal of the subsequently formed metal layer from diffusing toward the substrate 10, or prevent the metal of the adhesive-lattice-buffer layer 12 from diffusing toward the subsequently formed metal layer.

Referring to FIG. 3C, the metallic thin film 14 with equi-axial coarse grains 15 is formed on the diffusion-barrier-reaction layer 18 using an evaporation technique. The material of the metallic thin film 14 includes silver, copper, gold, palladium or nickel. The metallic thin film 14 has equi-axial coarse grains 15.

Figure 4A:
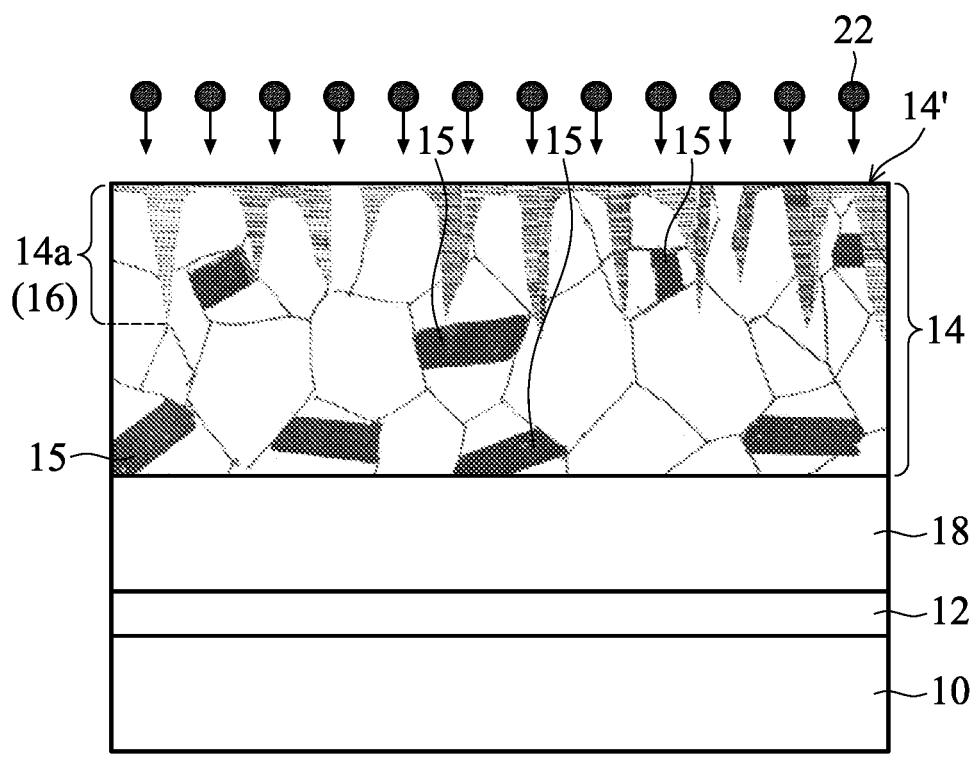
FIG. 4A is a cross-sectional view of applying an ion-beam bombardment on the surface of the metallic thin film formed by FIG. 3C in accordance with other embodiments of the present disclosure.

In accordance with some embodiments, as shown in FIG. 4A, an ion-beam bombardment 22 is performed on the upper surface 14' of the metallic thin film 14 containing equi-axial coarse grains 15 to transform the equi-axial coarse grains in the surface region 14a of the metallic thin film 14 into a high-density nano-twinned layer 16. The nano-twinned layer 16 located in the surface region 14a has nano-scale parallel-arranged twin boundaries (Σ3+Σ9), and the distance between the nano-scale parallel-arranged twin boundaries may be, for example, 1 nm to 100 nm. In some embodiments, the ion-beam bombardment 22 may use an argon ion beam or an oxygen ion beam. The flow rate of the ion beam may be 1 sccm to 20 sccm, or 3 sccm to 10 sccm. The voltage of the ion gun may be 10V to 5 KV, or 50V to 150V, or 60V to 100V. The current of the ion gun may be 0.2 A to 20 A. The temperature of the ion-beam bombardment may be 0° C. to 50° C. The voltage of the ion-beam bombardment may be 0.01 KeV to 1 KeV. The time of the ion-beam bombardment may be 15 minutes to 10 hours. It should be understood that the parameters of the ion-beam bombardment process described above may be appropriately adjusted according to practical applications, and are not intended to be limiting.

Figure 4B:
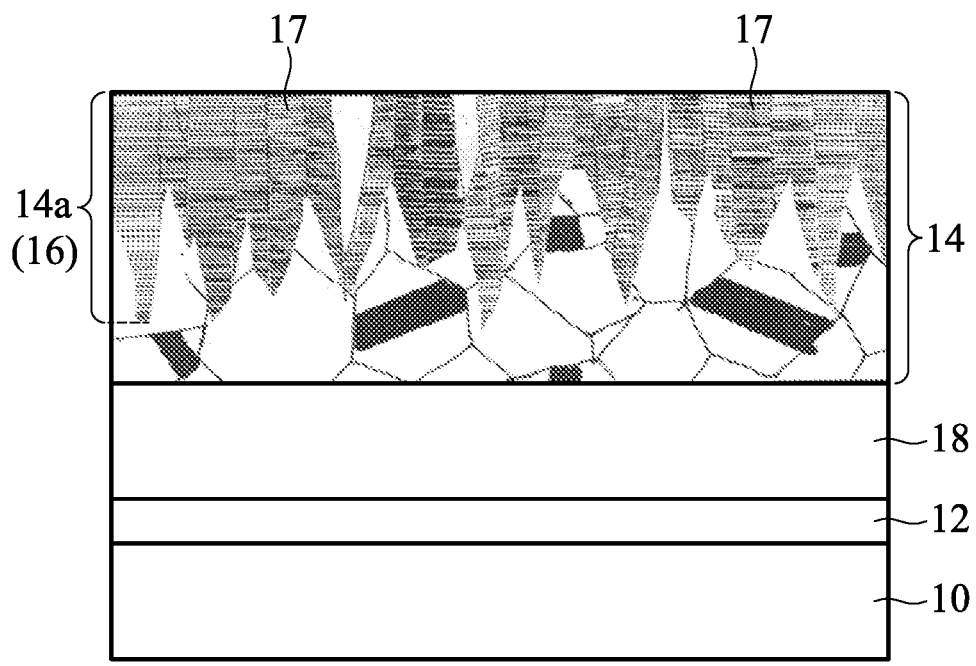
FIG. 4B is a cross-sectional view of a structure including an adhesive-lattice-buffer layer, a diffusion-barrier-reaction layer and a metallic thin film containing nano twins in the surface region thereof in accordance with some embodiments of the present disclosure.

In accordance with some embodiments, as shown in FIG. 4B, the nano-twinned layer 16 located in the surface region 14a of the metallic thin film 14 includes parallel-stacked nano-twinned pillars 17. In some embodiments, the thickness of the nano-twinned layer 16 may be 0.1 μm to 10 μm, such as 0.5 μm to 5 μm. In some embodiments, the diameters of the nano-twinned pillars 17 in the nano-twinned layer 16 may be 0.01 μm to 10 μm, such as 0.3 μm to 0.5 μm. It should be understood that the thickness of the nano-twinned layer 16 located in the surface region 14a of the metallic thin film 14 and the diameters of the nano-twinned pillars 17 may be appropriately adjusted according to practical applications, and are not intended to be limiting.

The present disclosure applies the ion-beam bombardment on the evaporated metallic thin film 14 with equi-axial coarse grains 15 so that the equi-axial coarse grains in the surface region 14a of the metallic thin film 14 are transformed into a high-density nano-twinned layer 16. The nano-twinned layer 16 includes nano-twinned pillars 17 composed of parallel-stacked high-density nano-twinned boundaries with the spacing of only 1 nanometer to 100 nanometers. In some embodiments, for the thickness of the nano-twinned layer 16 and the diameters of the nano-twinned pillars 17, reference may be made to the embodiment shown in FIG. 2B. Thus, it is not repeated again. It should be understood that the thickness of the nano-twinned layer 16 and the diameters of the nano-twinned pillars 17 may be appropriately adjusted according to practical applications, and are not limited to the embodiment shown in FIG. 2B.

The following describes the formation and detection results of some embodiments and comparative embodiments of the present disclosure in detail.

Figure 5A:
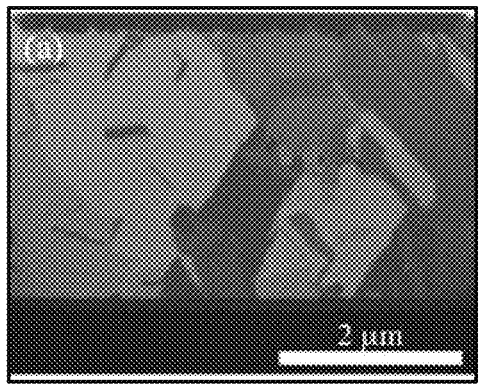
FIG. 5A is a focused ion beam (FIB) image of a cross-sectional view of an evaporated silver thin film on a single-crystalline silicon substrate in accordance with some comparative embodiments of the present disclosure.

FIG. 5A is based on some comparative embodiments. The focused ion beam (FIB) image of the cross-sectional view of the evaporated silver thin film on the (100) single-crystalline silicon substrate is shown. The evaporation parameters of the comparative embodiment are described as follows. Evaporation rate: titanium: 0.1 nm/s, silver: 1.8 nm/s; Thickness: 3 μm; Background pressure: less than $6\times10^{-6}$ Torr; Flow rate of argon: 4.5 sccm; Working pressure of argon: $1.5\times10^{-4}$ Torr; Rotation speed of stage: 10 rpm; and Process temperature: normal temperature.

The result of FIG. 5A shows that, in the cross-sectional view of the evaporated silver thin film, only equi-axial coarse grains and a few annealing twins exist. The spacing of the annealing twins is about 50 nanometers to 200 nanometers. Obviously, it is difficult to form nano twins only by evaporation without applying an ion-beam bombardment.

Figure 5B:
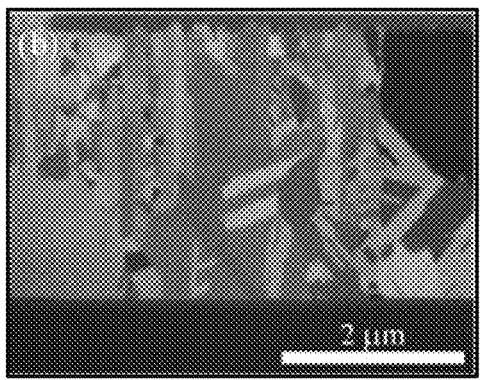
FIG. 5B is a focused ion beam (FIB) image of a cross-sectional view of a silver thin film on a single-crystalline silicon substrate, which is subjected to an ion-beam bombardment for 15 minutes on the surface of the evaporated silver thin film in accordance with some embodiments of the present disclosure.

FIG. 5B is based on some embodiments. The focused ion beam (FIB) image of the cross-sectional view of the silver thin film on the (100) single-crystalline silicon substrate, which is applied by an ion-beam bombardment for 15 minutes after evaporation is shown. The evaporation parameters of the embodiment are described as follows. Evaporation rate: titanium: 0.1 nm/s, silver: 1.8 nm/s; Thickness: 3 μm; Background pressure: less than $6\times10^{-6}$ Torr; Flow rate of argon: 4.5 sccm; Working pressure of argon: $1.5\times10^{-4}$ Torr; Rotation speed of stage: 10 rpm; Process temperature: normal temperature; Voltage of ion gun: 100V; and Current of ion gun: 0.4 A.

The result of FIG. 5B shows that after the evaporated silver thin film with equi-axial coarse grains is applied by the ion-beam bombardment for 15 minutes, in the cross-sectional view, there are many slender nano-twinned pillars in the surface region of the silver thin film. These nano-twinned pillars contain high-density parallel-stacked nano twins with a twin spacing of only 2 to 10 nanometers.

Figure 5C:
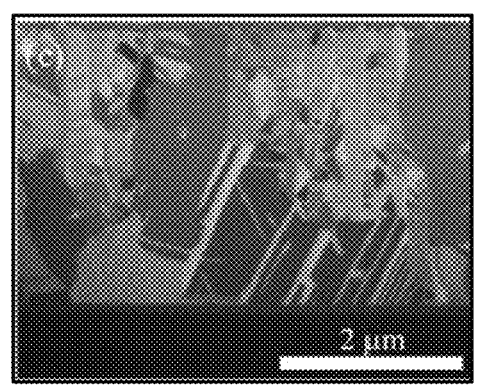
FIG. 5C is a focused ion beam (FIB) image of a cross-sectional view of a silver thin film on a single-crystalline silicon substrate, which is subjected to an ion-beam bombardment for 30 minutes on the surface of the evaporated silver thin film in accordance with some embodiments of the present disclosure.

FIG. 5C is based on some embodiments. The focused ion beam (FIB) image of the cross-sectional view of the silver thin film on the (100) single-crystalline silicon substrate, which is applied by an ion-beam bombardment for 30 minutes after evaporation is shown. The evaporation parameters of the embodiment are described as follows. Evaporation rate: titanium: 0.1 nm/s, silver: 1.8 nm/s; Thickness: 3 μm; Background pressure: less than $6\times10^{-6}$ Torr; Flow rate of argon: 4.5 sccm; Working pressure of argon: $1.5\times10^{-4}$ Torr; Rotation speed of stage: 10 rpm; Process temperature: normal temperature; Voltage of ion gun: 100V; and Current of ion gun: 0.4 A.

The result of FIG. 5C shows that after the evaporated silver thin film with equi-axial coarse grains is applied by the ion-beam bombardment for 30 minutes, in the cross-sectional view, the slender nano-twinned pillars in the surface region of the silver thin film not only become wider, but also increase in number. These nano-twinned pillars also contain high-density parallel-stacked nano twins with a twin spacing of only 2 to 10 nanometers. Obviously, after the silver thin film is formed by evaporation, by applying the ion-beam bombardment, high-density nano twins can be produced on the surface of the silver thin film. Also, the number of nano-twinned pillars will increase with the prolongation of time of the ion-beam bombardment.

Figure 6A:
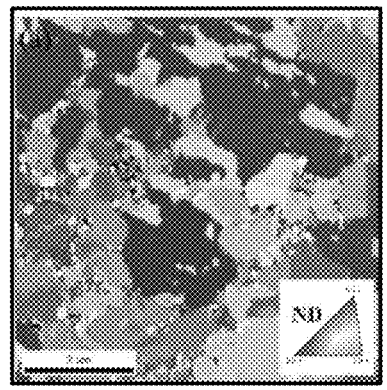
FIG. 6A is an electron backscatter diffraction (EBSD) image with a crystal orientation distribution of an upper surface of an evaporated silver thin film on a single-crystalline silicon substrate in accordance with some comparative embodiments of the present disclosure.

FIG. 6A is based on some comparative embodiments. The electron backscatter diffraction (EBSD) image of the cross-sectional view of the evaporated silver thin film on the (100) single-crystalline silicon substrate is shown. The evaporation conditions of this comparative embodiment are the same as those of the comparative embodiment shown in FIG. 5A.

The EBSD analysis result in FIG. 6A shows that only a few crystal grains on the upper surface of the evaporated silver thin film have the [111] preferred crystal orientation. Obviously, it is difficult to form nano twins with the preferred crystal orientation of [111] only by the evaporation without further applying the ion-beam bombardment.

Figure 6B:
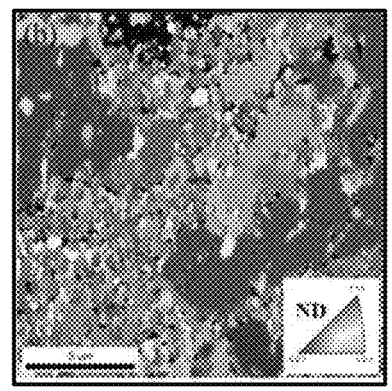
FIG. 6B is an electron backscatter diffraction (EBSD) image with a crystal orientation distribution of an upper surface of a silver thin film on a single-crystalline silicon substrate, which is subjected to an ion-beam bombardment for 15 minutes on the surface of the evaporated silver thin film in accordance with some embodiments of the present disclosure.

FIG. 6B is based on some embodiments. The electron backscatter diffraction (EBSD) image of the upper surface of the silver thin film on the (100) single-crystalline silicon substrate, which is applied by an ion-beam bombardment for 15 minutes after evaporation is shown. The conditions of evaporation and ion-beam bombardment of this embodiment are the same as the conditions of evaporation and ion-beam bombardment of the embodiment shown in FIG. 5B.

The EBSD analysis result in FIG. 6B shows that after the evaporated silver thin film with equi-axial coarse grains is applied by the ion-beam bombardment for 15 minutes, a large number of fine crystal grains with [111] preferred crystal orientation appear on the upper surface of the silver thin film, and the parallel-arranged twin boundaries have 36% of the [111] crystal orientation.

Figure 6C:
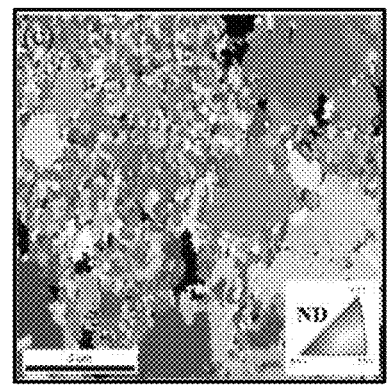
FIG. 6C is an electron backscatter diffraction (EBSD) image with a crystal orientation distribution of an upper surface of a silver thin film on a single-crystalline silicon substrate, which is subjected to an ion-beam bombardment for 30 minutes on the surface of the evaporated silver thin film in accordance with some embodiments of the present disclosure.

FIG. 6C is based on some embodiments. The electron backscatter diffraction (EBSD) image of the upper surface of the silver thin film on the (100) single-crystalline silicon substrate, which is applied by an ion-beam bombardment for 30 minutes after evaporation is shown. The conditions of evaporation and ion-beam bombardment of this embodiment are the same as the conditions of evaporation and ion-beam bombardment of the embodiment shown in FIG. 5C.

The result of FIG. 6C shows that after the evaporated silver thin film with equi-axial coarse grains is applied by the ion-beam bombardment for 30 minutes, the fine crystal grains with [111] preferred crystal orientation on the upper surface of the silver thin film are more greatly increased, and the parallel-arranged twin boundaries have 45% of the [111] crystal orientation, representing an increase in the number of nano-twinned pillars.

Figure 7:
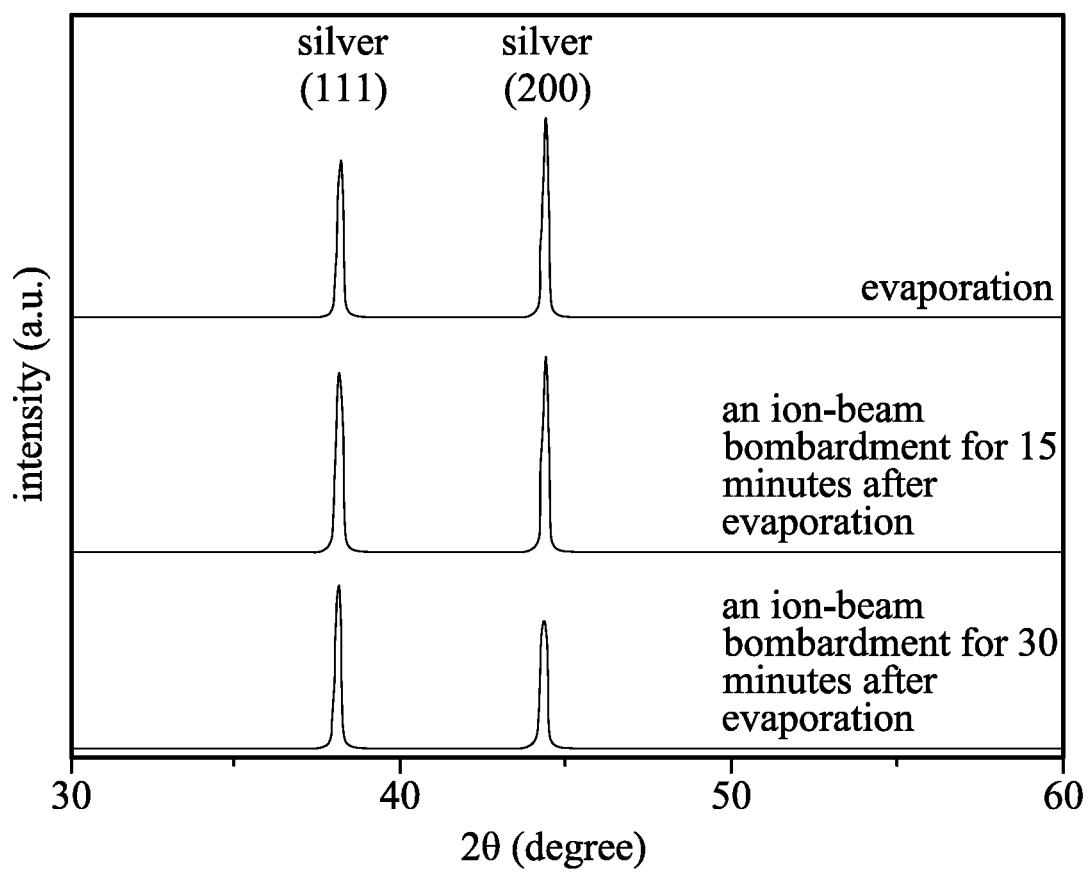
FIG. 7 includes X-ray diffraction (XRD) patterns of an evaporated silver thin film without an ion-beam bombardment and evaporated silver thin films which are subjected to an ion-beam bombardment for 15 minutes and 30 minutes respectively on a single-crystalline silicon substrate in accordance with some embodiments of the present disclosure.

FIG. 7 is based on some embodiments. The X-ray diffraction (XRD) patterns of an evaporated silver thin film without applying an ion-beam bombardment and silver thin films which are subjected to an ion-beam bombardment for 15 minutes and 30 minutes respectively after evaporation on a (100) single-crystalline silicon substrate are shown.

The results in FIG. 7 show that after the evaporation is completed, the X-ray diffraction (XRD) of the silver thin films shows two spectral lines Ag (111) and Ag (200). Ag (111) is the preferred orientation of silver nano twins. It can be seen from the figure that, after the evaporated silver thin films with equi-axial coarse grains are applied by an ion-beam bombardment for 15 minutes and 30 minutes respectively, the Ag (200) spectral line is significantly reduced. Obviously, after the silver thin film is formed by evaporation, by applying the ion-beam bombardment, the ratio of (111) preferred crystal orientation of silver thin film increases, and the ratio of (111) preferred crystal orientation increases with the prolongation of time of the ion-beam bombardment.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a nano-twinned structure on a metallic thin film surface, comprising:
    forming an adhesive-lattice-buffer layer on a substrate;
    forming a metallic thin film comprising equi-axial coarse grains on the adhesive-lattice-buffer layer by evaporation; and
    performing an ion-beam bombardment, having a temperature of 0° C. to 50° C. and a voltage of 0.01 KeV to 1 KeV, on a surface of the metallic thin film to transform an upper portion of the equi-axial coarse grains into a nano-twinned structure, wherein the nano-twinned structure comprises parallel-arranged twin boundaries (Σ3+Σ9) with a twin spacing of 2 nm to 10 nm, and the parallel-arranged twin boundaries account for 50% to 80% of total twin boundaries in a cross-sectional view of the metallic thin film, wherein the parallel-arranged twin boundaries comprise 30% to 90% [111] crystal orientation.

2. The method as claimed in claim 1, wherein the adhesive-lattice-buffer layer is formed by sputtering or evaporation.

3. The method as claimed in claim 1, wherein the ion-beam bombardment has a time of 15 minutes to 10 hours.

4. The method as claimed in claim 1, further comprising forming a diffusion-barrier-reaction layer between the adhesive-lattice-buffer layer and the metallic thin film by evaporation, sputtering or electroplating.

5. The method as claimed in claim 1, wherein the substrate comprises a silicon substrate, a silicon carbide substrate, a gallium arsenide substrate, a sapphire substrate or a glass substrate.

\* \* \* \* \*